(12) United States Patent
Barker et al.

(10) Patent No.: US 11,533,828 B2
(45) Date of Patent: Dec. 20, 2022

(54) ELECTRONIC COOLING SYSTEMS

(71) Applicant: RAYTHEON COMPANY, Waltham, MA (US)

(72) Inventors: Delmar L. Barker, Tucson, AZ (US); Paul M. Lyons, Tucson, AZ (US)

(73) Assignee: RAYTHEON COMPANY, Waltham, MA (US)

(*) Notice: Subject to any disclaimer, the term of this patent is extended or adjusted under 35 U.S.C. 154(b) by 50 days.

(21) Appl. No.: 15/930,611

(22) Filed: May 13, 2020

(65) Prior Publication Data
US 2021/0360830 A1    Nov. 18, 2021

(51) Int. Cl.
*H05K 7/20* (2006.01)
*F25B 9/02* (2006.01)

(52) U.S. Cl.
CPC ........ *H05K 7/20772* (2013.01); *F25B 9/02* (2013.01); *H05K 7/20272* (2013.01); *H05K 7/20836* (2013.01)

(58) Field of Classification Search
CPC ..... F25B 9/02; F25B 19/005; H05K 7/20272; H05K 7/20836; F28F 3/12
See application file for complete search history.

(56) References Cited

U.S. PATENT DOCUMENTS

| | | |
|---|---|---|
| 3,751,660 A | 8/1973 | Thurston |
| 3,997,758 A | 12/1976 | Patel |
| 4,838,041 A * | 6/1989 | Bellows ............... F25B 19/005 165/80.2 |
| 5,021,924 A * | 6/1991 | Kieda ................. H01L 23/4336 361/698 |
| 6,374,619 B1 * | 4/2002 | Bessendorf ........... F17C 13/006 62/51.1 |
| 8,983,019 B2 | 3/2015 | Varanasi et al. |
| 9,557,090 B2 | 1/2017 | Katkov et al. |
| 9,638,452 B2 | 5/2017 | Katkov et al. |
| 10,985,089 B2 * | 4/2021 | Hart ....................... H01L 23/14 |
| 2004/0025518 A1 * | 2/2004 | Ruehlich ................... F25B 9/14 62/6 |
| 2006/0034051 A1 * | 2/2006 | Wang ................. H05K 7/20209 361/696 |
| 2015/0007965 A1 * | 1/2015 | Joshi ..................... F28F 13/185 165/104.28 |

(Continued)

OTHER PUBLICATIONS

Kwon et al., "Increasing Leidenfrost point using micro-nano hierarchical surface structures", Applied Physics Letters 103, 201601 (2013), pp. 1-6.

(Continued)

*Primary Examiner* — Lionel Nouketcha
(74) *Attorney, Agent, or Firm* — Cantor Colburn LLP

(57) ABSTRACT

Disclosed herein are cooling systems, methods of making cooling systems, and methods of cooling using cooling systems. A cooling system includes a compression container with a coolant that includes a fluid. A valve is arranged on the compression container through which the coolant is released from the compression container. The cooling system further includes a component positioned to receive droplets of the coolant. The component has a surface with a three-dimensional topography that includes a plurality of pillars and a plurality of trenches. The component is an electronic component or a photoelectronic component.

11 Claims, 4 Drawing Sheets

(56) References Cited

U.S. PATENT DOCUMENTS

2017/0349547 A1   12/2017   Cooks et al.

OTHER PUBLICATIONS

Sajadi et al., "Surfaces for high heat dissipation with no Leidenfrost limit", Applied Physics Letters 111, 021605 (2017), pp. 1-6.
Wikipedia, "Leidenfrost effect", (2018), p. 1-6, https://en.wikipedia.org/w/index/php?title=Leidenfrost_effect&oldid=865864819.

* cited by examiner

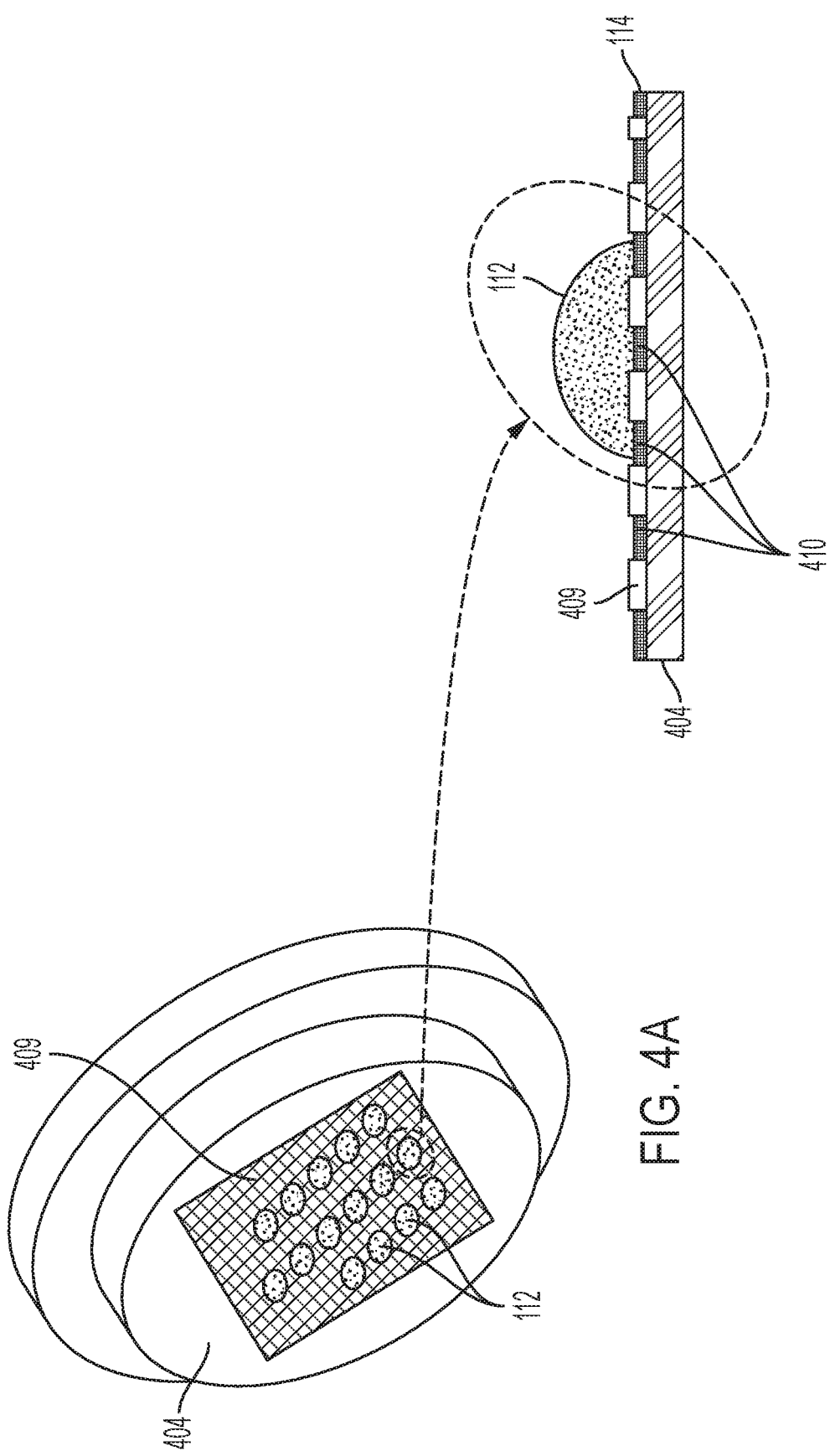

ELECTRONIC COOLING SYSTEMS

BACKGROUND

Hot surfaces, such as small electronic and photoelectronic components can be cooled by applying a cooling liquid to the hot surface. When the surface is significantly hotter than the liquid's boiling point, the applied liquid produces an insulating vapor layer on the hot surface that keeps the liquid from boiling rapidly. The bottom portion of the liquid vaporizes upon contact with the hot surface at temperatures above the Leidenfrost point. Because of this repulsive effect, the liquid droplet hovers over the hot surface rather than making contact with the hot surface, which retards heat transport and prevents proper cooling because the vapor has a lower thermal conductivity than the liquid. This phenomenon is called the Leidenfrost Effect.

The Leidenfrost point of a liquid on a hot surface depends on many factors, including the type of liquid, impurities, and hot surface properties. For water on a hot pan, the Leidenfrost effect occurs as the temperature exceeds about 193° C.

SUMMARY

Disclosed herein are cooling systems, methods of making cooling systems, and methods of cooling using cooling systems. A non-limiting example of a cooling system includes a compression container with a coolant that includes a fluid. A valve is arranged on the compression container through which the fluid is released from the compression container. The cooling system further includes a component positioned to receive droplets of the coolant. The component has a surface with a three-dimensional topography that includes a plurality of pillars and a plurality of trenches. The component is an electronic component, a photoelectronic component, or a combination thereof.

Another non-limiting example of a cooling system includes a compression container that includes a coolant. The coolant includes a fluid. The cooling system includes a valve arranged on the compression container through which the fluid is released from the compression container. The cooling system further includes a component positioned to receive droplets from the fluid. The component has a surface with a three-dimensional topography that includes a mesh with a plurality of openings. The component is an electronic component, a photoelectronic component, or a combination thereof.

A non-limiting example of cooling a component includes opening a valve of a compression container that includes a coolant. The coolant includes a fluid. Droplets of the coolant are applied to a surface of the component. The surface has a three-dimensional topography, and the component is an electronic component, a photoelectronic component, or a combination thereof.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIG. 4A is a schematic diagram that illustrates a perspective view of a hot surface with a mesh arranged on the surface according to aspects of the present invention; and FIG. 4B is a schematic diagram showing an expanded side view of a droplet on the hot surface of FIG. 4A.

DETAILED DESCRIPTION

In order to cool components, such as electronics and photoelectronic components, a higher Leidenfrost point is desirable, which would allow liquid droplets to come into direct contact with the hot surface. Described herein are cooling systems and methods that use modified surfaces that eliminate or mitigate the Leidenfrost effect so that Joule-Thomson cooling is more efficient. The systems and methods include forcing a liquid and/or a real gas (e.g., nitrogen and/or argon) through a valve while keeping it insulated so that no heat is exchanged with the environment, which result in a change in temperature called the Joule-Thomson effect. The mixed phase of vapor and liquid droplets are applied to a hot surface that includes three-dimensional topography with macroscopic or microscopic features on the surface, such as a plurality of pillars and trenches. The surface features allow the vapor layer that is formed on the hot surface to move through the features, horizontally across the hot surface, which lowers the surface liquid closer to the surface for faster cooling.

Figure 1A:
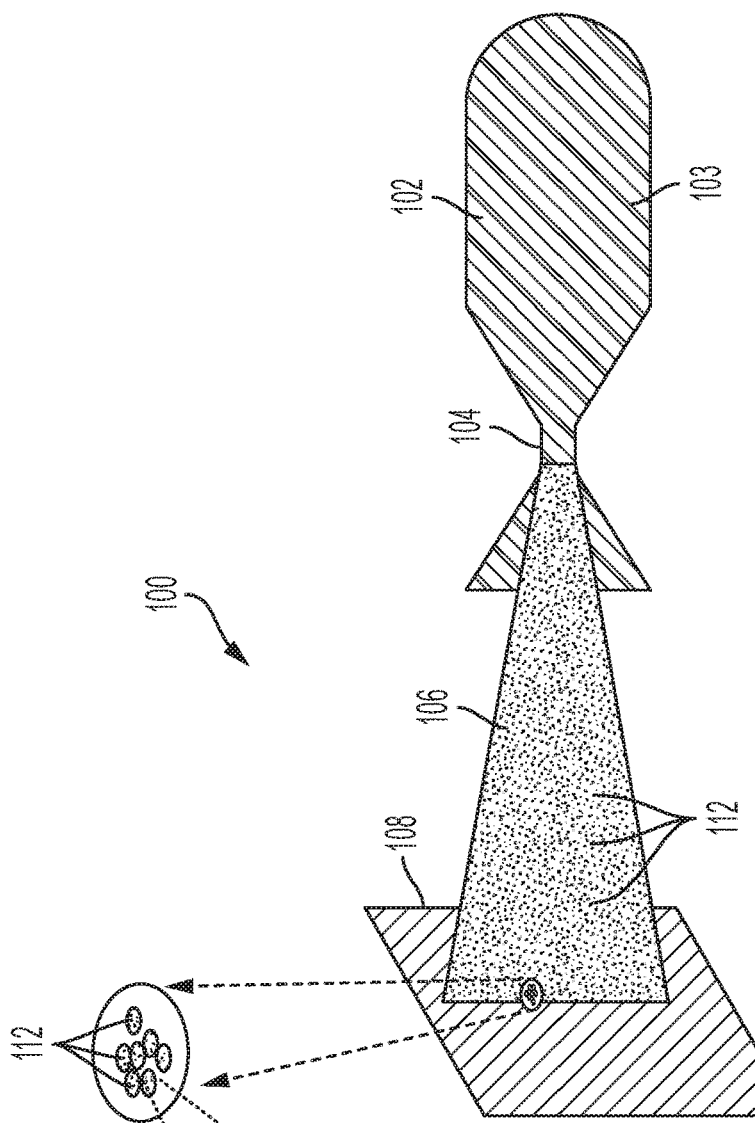
FIG. 1A is a schematic diagram that illustrates a system for cooling according to aspects of the present invention.

FIG. 1A is a schematic diagram that illustrates a cooling system 100 and method for cooling according to aspects of the present invention. The system 100 includes a compression container 102 of a coolant 103 within. The coolant 103 includes a fluid, which can be a fluid mixture.

The coolant 103 includes a pressurized liquid or a compressed gas, or a mixture thereof. Non-limiting examples of liquids and/or compressed gases include nitrogen ($N_2$), argon, krypton, or an engineered refrigerant, for example, a hydrochlorofluorocarbon (e.g., R22 or R134A).

In some aspects, the fluid within the compression container 102 is maintained at a pressure of about 100 to about 8000 pounds per square in gauge (psig). In other aspects, the fluid within the compression container 102 is maintained at a pressure of about 6000 to about 7000 psig.

The compression container 102 includes a valve 104 (also referred to as a porous plug or orifice) through which the coolant 103 is pushed through. The coolant 103 moves through the valve 104 and expands, which results in a decrease in temperature, called the Joule-Thomson effect.

The coolant 103 that comes out of the valve 104 is a fluid 106 of cooling liquid droplets and vapor, or liquid only. According to some aspects, the temperature of the fluid 106 as it is released from the compression container 102 through the valve 104 is about −200 to about −40° C. According to other aspects, the temperature of the fluid 106 as it is released from the compression container 102 through the valve 104 is about −200 to about −150° C.

A hot surface 108 of a component is positioned to receive a plurality of droplets 112 of the fluid 106 of the coolant 103. The fluid 106 is continuously sprayed onto the hot surface 108 of the component, such as an electronic component or photoelectronic component.

Figure 1B:
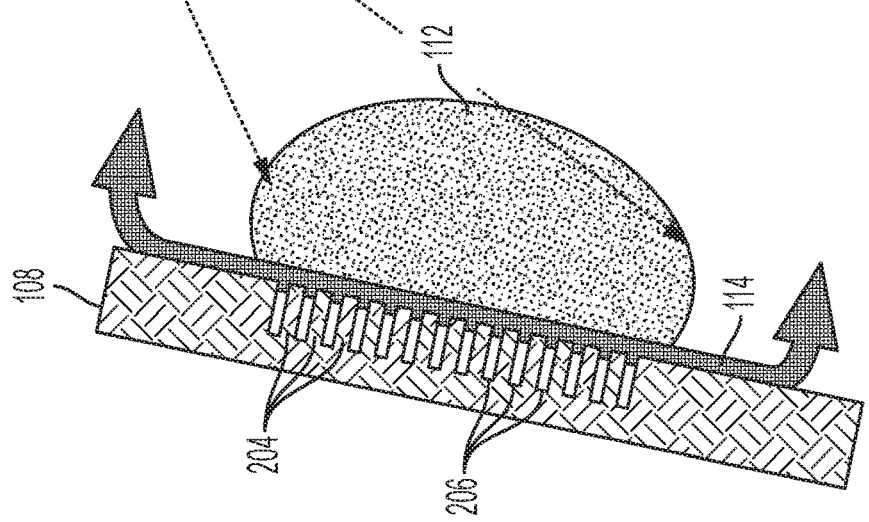
FIG. 1B is a schematic diagram showing an expanded side view of a droplet on the hot surface in FIG. 1A.

A mixture of droplets 112 form between the valve 104 and the hot surface 108. A plurality of droplets 112 form on the hot surface 108, shown in the expanded view in FIG. 1B of one of the droplets 112 in FIG. 1A. The Leidenfrost effect occurs is a vapor layer 114 that forms on the hot surface 108. Although the vapor layer 114 can retard heat absorption, the hot surface 108 is modified with surface features that thin the vapor layer 114 so that the droplet 112 can move closer to the hot surface 108 and increase the rate of cooling of the hot surface 108.

The modified surface includes a three-dimensional topography, such as macroscopic or microscopic features or texture, that thin the vapor layer 114 and allows the droplet 112 to move closer to and eventually touch features of the hot surface 108. The surface features can include, in some aspects, a plurality of pillars 204 and/or a plurality of trenches 206. As the droplet 112 nears the hot surface 108, the vapor spreads out through the trenches 206. Movement of the vapor through the trenches 206 allows the droplet 112 to touch the pillars 204 and exchange heat from the hot surface 108. The hot surface 108 is continuously re-wet when the capillary pressure overcomes the pressure of the vapor layer 114.

According to some aspects, the component with the hot surface 202 is an electronic component, such as a processor chip, or other like small electronics. According to other aspects, the component with the hot surface 202 is a photoelectronic component, such as an infrared (IR) detector.

According to some aspects, the temperature of the hot surface 108 prior to cooling with the droplet 112 is about −40 to about 60° C. According to other aspects, the temperature of the hot surface 108 prior to cooling with the droplet 112 is about 20 to about 25° C.

After cooling with the droplet 112, the change in temperature of the hot surface 108 is about −200 to about 40° C. According to other aspects, the temperature change of the hot surface 108 is about −200 to about −150° C.

Figure 2:
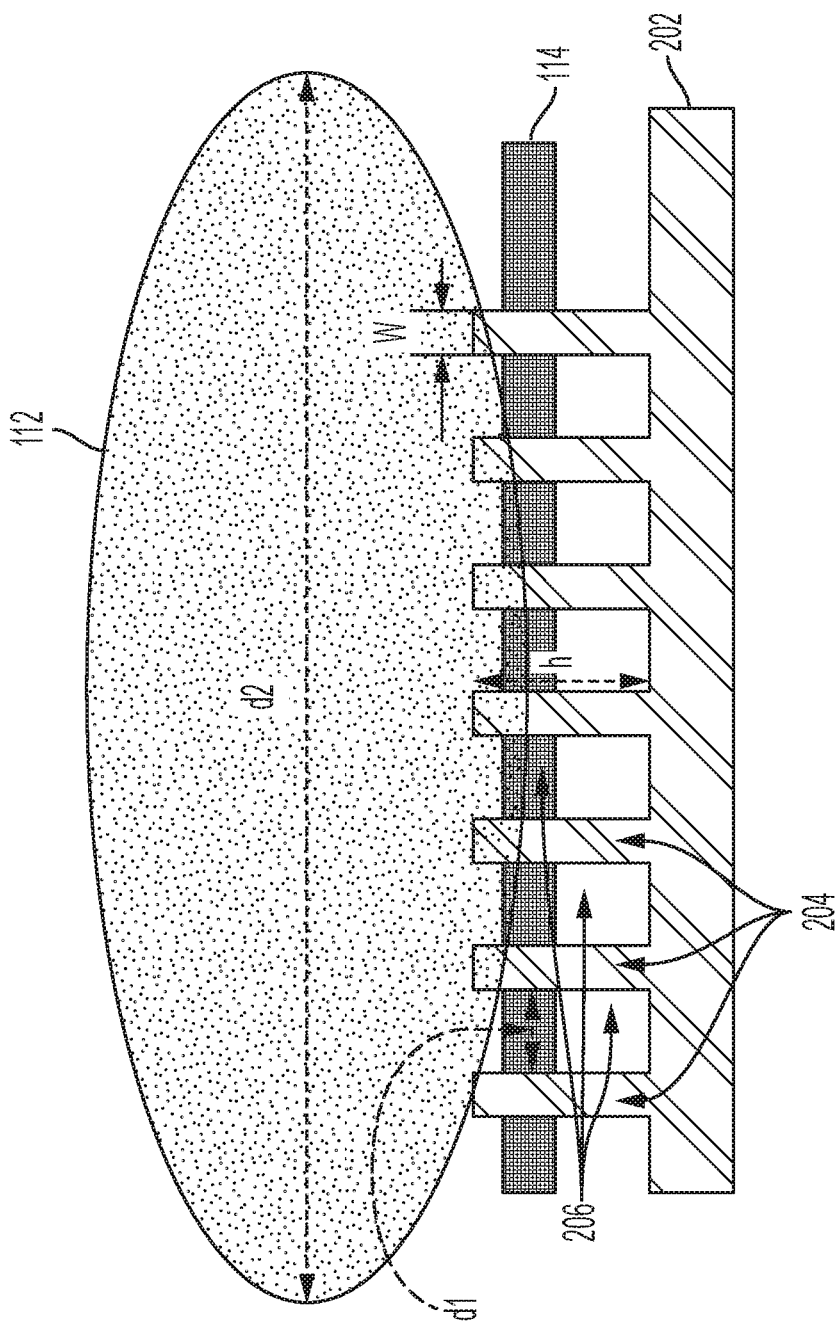
FIG. 2 is a schematic diagram that illustrates a side view of a droplet on a hot surface with a plurality of pillars according to aspects of the present invention.

FIG. 2 is a schematic diagram that illustrates a cross-sectional side view of a hot surface 202 with three-dimensional topography that includes a plurality of pillars 204 with a plurality of trenches 206 there between. The cooling droplet 112 rests on the plurality of pillars 204, as the vapor layer 114 from the Leidenfrost effect is forced into the plurality of trenches 206 between the plurality of pillars 204, which allows the liquid in the droplet 112 to move closer to the hot surface 202. As shown, at least a portion of the vapor layer 114 is pushed into the plurality of trenches 206, which allows the vapor in the vapor layer 114 to be expelled away from the hot surface 202 through the trenches 206.

The plurality of pillars 204 have dimensions that vary and depend on the size of the droplet 112. According to some aspects, the droplet 112 has a diameter d2 of about 2 centimeters (cm) to about 1 micrometer. According to other aspects, the droplet 112 has a diameter of about 1 micrometer to about 50 micrometers.

According to some aspects, the pillars 204 on the hot surface 202 have a width (w) that is equal to the diameter of the droplet (d2) divided by 10 (d2/10). According to other aspects, the pillars 204 have a height (h) that is equal to the diameter of the droplet (d2) divided by 10 (d2/10). Yet, according to some aspects, the distance (d1) between the pillars 204, or a width of the trenches 206, is equal to the diameter of the droplet (d2) divided by 10 (d2/10).

Although the pillars 204 and trenches 206 are shown as being regularly spaced on the hot surface 202, the pillars 204 and trenches 206 do not have to be regularly spaced and are irregularly spaced in some aspects.

Figure 3:
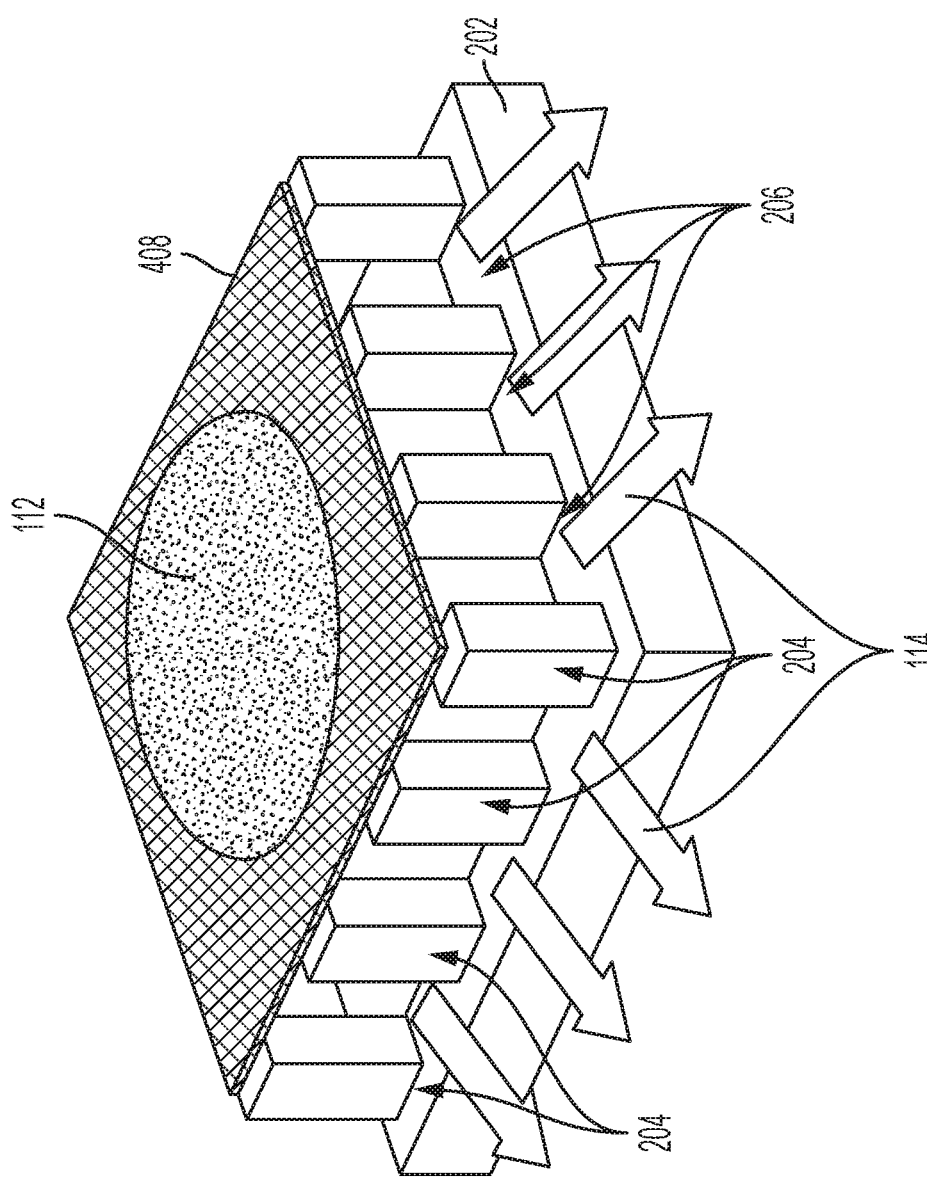
FIG. 3 is a schematic diagram that illustrates a perspective view of a hot surface with a plurality of pillars and an intermediate mesh according to aspects of the present invention.

FIG. 3 is a schematic diagram that illustrates a perspective view of a hot surface 202 with a plurality of pillars 204 and trenches 206 therebetween. A perforated layer 408, such as a mesh, is arranged on top of the pillars 204. Although one perforated layer 408 is shown, any number of perforated layers 408 can be used and stacked on top of one another. The droplet 112 rests on perforated layer 408 so that it does not fall into the trenches 206 between the pillars 204 as it evaporates and therefore shrinks. The droplet 112 remains on top of the plurality of pillars 204 to transfer heat. As shown, the vapor layer 114 is pushed into the trenches 206 between the pillars 204, which mitigates the Leidenfrost effect and lowers the cooling droplet 112 closer to the surface of the hot surface 202 for faster cooling. As the droplet 112 cools, it will eventually get smaller than the spaces between the pillars 204, and the perforated layer 408 compensates for that effect.

As shown, the pillars 204 and trenches 206 therebetween are arranged on all four sides of the hot surface 202, such that the vapor from the vapor layer 114 is pushed through the pillars 204 and away from the hot surface 202 from all sides. Yet, in some aspects, pillars 204 and trenches 206 are arranged on one side, two sides, or three sides of the hot surface 202, and the vapor from the vapor layer 114 is expelled and pushed away from one, two, or three sides of the hot surface 202.

In order to form the plurality of pillars 204, a plurality of trenches 206 (or grooves) are formed in the surface of the hot surface 202, for example, by using one or more etching processes to remove a portion of material from the hot surface 202. The plurality of pillars 204 and trenches 206 can be formed by lithography and etching. The dimensions and regularity or non-regularity of the pillars 204 and trenches 206 are varied as described above.

FIG. 4A is a schematic diagram that illustrates a perspective view of a hot surface 404 with a mesh 409 that provides three-dimensional topography for the plurality of cooling droplets 112 arranged on the surface. FIG. 4B is a schematic diagram showing an expanded side view of a droplet 112 on the mesh 409 on the hot surface 404 of FIG. 4A.

As shown in FIG. 4B, the mesh 409 includes a plurality of openings 410 that form trenches on the hot surface 404. The cooling droplet 112 rests on the mesh 409, and the vapor layer 114 from the Leidenfrost effect is pushed into the openings 410 in the mesh 409, which allows the liquid in the droplet 112 to move closer to the hot surface 202. As shown, at least a portion of the vapor layer 114 is pushed into the openings 410, which allows the vapor in the vapor layer 114 to be expelled away from the hot surface 404. Due to the geometry of the mesh 409, it must be elevated above the hot surface 202 below it when pillars are not present.

The dimensions of the openings 410 in the mesh 409 have dimensions that vary and depend on the size of the droplet 112. According to some aspects, the openings 410 have a diameter that is equal to the diameter of the droplet (d2) divided by 10 (d2/10). Although the openings 410 in the mesh 409 are shown as being regularly spaced on the hot surface 404, the openings 410 do not have to be regularly spaced and are irregularly spaced in some aspects. The mesh 409 must be elevated above the hot surface 202 below in order for vapor from the vapor layer 114 to escape.

The mesh 409 can be separately formed and then arranged on or adhered to the hot surface 404, or the mesh 409 can be formed directly on the hot surface 404 by forming openings 410 in a layer of material arranged on the hot surface 404.

Methods of making modified hot surfaces, as shown in FIGS. 1A-4B, include adding three-dimensional surface topography to the hot surfaces, which allows the cooling droplets to force the vapor layer into the surface features. The three-dimensional surface topography can be a plurality of pillars with a plurality of trenches therebetween, or a mesh with a plurality of openings or trenches, for example. The hot surface is part of a small electronic component, such as a processor or chip, or a photoelectronic component, such as an IR detector. Depending on the type of device/application, the surface includes one or more materials, for example, a semiconductor, a metal, or a combination thereof.

The above systems are used to cool components, such as electronic components and photoelectronic components, which may or may not be heat generating. The methods include opening the valve of the compression container with the coolant. The coolant includes a fluid, which can be a fluid mixture. The methods include applying a droplet of the coolant to a hot surface of the component. The hot surface includes three-dimensional surface topography, such as a plurality pillars and a plurality of trenches or a mesh with a plurality of openings, and the component is an electronic component or a photoelectronic component.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A cooling system comprising:
a compression container comprising a coolant, the coolant comprising a fluid;

a valve arranged on the compression container through which the coolant is released from the compression container; and a unitary component positioned to receive droplets from the coolant and comprising a surface with a three-dimensional topography that includes a mesh with a plurality of openings, and the unitary component being an electronic component, a photoelectronic component, or a combination thereof;

wherein the surface with the three-dimensional topography is a hot surface of the electronic component, a photoelectronic component, or a combination thereof, and a distance between trenches is about 0.1 micrometers to about 5 micrometers.

2. The cooling system of claim 1, wherein the fluid comprises a fluid mixture.

3. The cooling system of claim 2, wherein the fluid mixture comprises nitrogen ($N_2$).

4. The cooling system of claim 3, wherein the fluid mixture further comprises argon, krypton, an engineered refrigerant, or a mixture thereof.

5. The cooling system of claim 1, wherein the unitary component is the photoelectronic component.

6. The cooling system of claim 5, wherein the photoelectronic component is an infrared (IR) detector.

7. The cooling system of claim 1, wherein the surface of the unitary component has a temperature of about −40 to about 60° C.

8. A method of cooling a unitary component, the method comprising:

opening a valve of a compression container comprising a coolant, the coolant comprising a fluid; and applying droplets of the coolant to a surface of the unitary component, the surface comprising a three-dimensional topography that includes a mesh with a plurality of openings, and the unitary component being an electronic component, a photoelectronic component, or a combination thereof;

wherein the surface with the three-dimensional topography is a hot surface of the electronic component, a photoelectronic component, or a combination thereof, and a distance between trenches is about 0.1 micrometers to about 5 micrometers.

9. The method of claim 8, wherein the fluid comprises a fluid mixture.

10. The method of claim 9, wherein the fluid mixture comprises nitrogen ($N_2$), argon, krypton, an engineered refrigerant, or a mixture thereof.

11. The method of claim 8, wherein the three-dimensional topography comprises a plurality of pillars and a plurality of trenches.

* * * * *